(12) United States Patent
Yang et al.

(10) Patent No.: US 9,642,249 B2
(45) Date of Patent: May 2, 2017

(54) RESIN COMPOSITION, PREPREG, AND SUBSTRATE EMPLOYING THE SAME

(71) Applicant: INDUSTRIAL TECHNOLOGY RESEARCH INSTITUTE, Hsinchu (TW)

(72) Inventors: Wei-Ta Yang, Jhongli (TW); Li-Chun Liang, Zhudong Township (TW); I-Hong Lin, Luodong Township (TW); Chung-Cheng Lin, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 459 days.

(21) Appl. No.: 14/266,405

(22) Filed: Apr. 30, 2014

(65) Prior Publication Data

US 2014/0322545 A1 Oct. 30, 2014

(30) Foreign Application Priority Data

Apr. 30, 2013 (TW) .............................. 102115370 A
Apr. 11, 2014 (TW) .............................. 103113346 A

(51) Int. Cl.
*H05K 1/03* (2006.01)
*B29B 7/90* (2006.01)
*B29K 69/00* (2006.01)

(52) U.S. Cl.
CPC ............. *H05K 1/0366* (2013.01); *B29B 7/90* (2013.01); *B29K 2069/00* (2013.01); *H05K 1/0326* (2013.01); *H05K 2201/0209* (2013.01); *Y10T 428/31681* (2015.04); *Y10T 428/31725* (2015.04)

(58) Field of Classification Search
CPC ............... H05K 1/0366; H05K 1/0326; H05K 2201/0209; B29B 7/90; C08G 59/063; C08G 59/3218; C08G 65/485; C08G 65/44; Y01T 428/31725; Y10T 428/31681; B29K 2069/00
See application file for complete search history.

(56) References Cited

U.S. PATENT DOCUMENTS

| | | | |
|---|---|---|---|
| 4,784,917 A | 11/1988 | Tawara et al. | |
| 5,043,367 A | 8/1991 | Hallgren et al. | |
| 5,218,030 A | 6/1993 | Katayose et al. | |
| 5,223,568 A | 6/1993 | Landi et al. | |
| 5,571,609 A | 11/1996 | St. Lawrence et al. | |
| 6,048,807 A | 4/2000 | Landi | |
| 6,071,836 A | 6/2000 | St. Lawrence et al. | |
| 6,306,963 B1 | 10/2001 | Lane et al. | |
| 7,148,279 B2 | 12/2006 | Voorheis et al. | |
| 7,288,587 B2 | 10/2007 | Saitou et al. | |
| 7,838,576 B2 | 11/2010 | Inoue et al. | |
| 8,277,948 B2 | 10/2012 | Mizuno et al. | |
| 2003/0144430 A1 | 7/2003 | Liu et al. | |
| 2004/0242802 A1 | 12/2004 | Voorheis et al. | |
| 2007/0213499 A1* | 9/2007 | Uera | C08G 59/063 528/205 |
| 2009/0266591 A1 | 10/2009 | Amou et al. | |
| 2010/0119716 A1* | 5/2010 | Chapman Irwin | C08G 65/485 427/331 |
| 2010/0129676 A1 | 5/2010 | Fujimoto et al. | |
| 2010/0233495 A1 | 9/2010 | Mizuno et al. | |
| 2010/0305239 A1 | 12/2010 | Wei et al. | |
| 2012/0214009 A1 | 8/2012 | Mizuno et al. | |
| 2012/0315814 A1 | 12/2012 | Fung et al. | |
| 2013/0000843 A1 | 1/2013 | Mizuno et al. | |
| 2013/0040153 A1 | 2/2013 | Fujimoto et al. | |

FOREIGN PATENT DOCUMENTS

| | | |
|---|---|---|
| CN | 102115569 A | 7/2011 |
| CN | 103013110 A | 4/2013 |
| JP | 59-193929 A | 11/1984 |
| JP | 62-45630 A | 2/1987 |
| JP | 62-109828 A | 5/1987 |
| JP | 63-159443 A | 7/1988 |
| JP | 8-225665 A | 9/1996 |
| JP | 8-231848 A | 9/1996 |
| JP | 10-60138 A | 3/1998 |
| JP | 11-12456 A | 1/1999 |
| JP | 2004-511580 A | 4/2004 |
| JP | 2004-231847 A | 8/2004 |
| JP | 2005-105061 A | 4/2005 |
| JP | 2008-5620 A | 1/2008 |
| JP | 2009-35710 A | 2/2009 |
| JP | 2011-1473 A | 1/2011 |
| JP | 4613977 B2 | 1/2011 |
| TW | 574313 B | 2/2004 |
| TW | 200904896 A | 2/2009 |
| TW | 201122032 A1 | 7/2011 |
| TW | 201124478 A1 | 7/2011 |
| TW | 201249902 A1 | 12/2012 |
| TW | I412564 B | 10/2013 |
| WO | WO 01/85840 A2 | 11/2001 |

OTHER PUBLICATIONS

Leu et al, Synergistic effect of a phosphorus-nitrogen flame retardant on engineering plastics, Journal of Applied Plymer Science, vol. 92, Issue 1, pp. 410-417, Apr. 5, 2004.*

(Continued)

*Primary Examiner* — Alexander Kollias
(74) *Attorney, Agent, or Firm* — Birch, Stewart, Kolasch & Birch, LLP

(57) ABSTRACT

A disclosure provides a resin composition, a prepreg, and a substrate employing the same. According to an embodiment of the disclosure, the resin composition includes a polyphenylene ether compound, and a bismaleimide. The prepreg includes a cured product of the resin composition. The substrate includes a product fabricated by the resin composition or the prepreg.

20 Claims, No Drawings

(56) References Cited

OTHER PUBLICATIONS

Chinese Office Action and Search Report dated Dec. 1, 2015, for Chinese Application No. 201410174284.6.
Chao et al., "Poly(2,6-Dimethyl-1,4-Phenylene Ether) (PPE) Redistribution and its Significance in the Preparation of PPE/Epoxy Laminate," Reactive Polymers, vol. 15, Nov. 1991, pp. 9-23.
Gao et al., "Properties and Origins of High-Performance Poly(phenylene oxide)/Cyanate Ester Resins for High-Frequency Copper-Clad Laminates," Journal of Applied Polymer Science, vol. 121, Issue 3, Aug. 5, 2011 (Published online Mar. 4, 2011), pp. 1675-1684.
Wang et al., "Thermal and Physical Properties of Allyl PPO and Its Composite," Journal of Applied Polymer Science, vol. 102, Issue 5, Dec. 5, 2006, pp. 4111-4115.
White, "Polymerization by Oxidative Coupling. II. Co-Redistribution of Poly(2,6-diphenyl-1,4-phenylene Ether) with Phenols," Journal of Polymer Science, Part A-1: Polymer Chemistry, vol. 9, Issue 3, Mar. 1971, pp. 663-675.
Taiwan Office Action for Appl. No. 103113346 dated Mar. 25, 2015.

\* cited by examiner

RESIN COMPOSITION, PREPREG, AND SUBSTRATE EMPLOYING THE SAME

CROSS REFERENCE TO RELATED APPLICATIONS

The present application is based on, and claims priorities from Taiwan Application Serial Number 102115370, filed on Apr. 30, 2013, and Taiwan Application Serial Number 103113346, filed on Apr. 11, 2014, the disclosure of which is hereby incorporated by reference herein in its entirety.

TECHNICAL FIELD

The technical field relates to a resin composition, a prepreg, and a substrate employing the same.

BACKGROUND

New generations of electronic products stress the properties of being light, thin, short and small, and suitable for high-frequency transmission. Thus the layout of printed circuit boards (PCB) is geared towards high density with more rigorous requirements for the choice of printed circuit board (PCB) material. High-frequency electronic components are connected to the printed circuit board (PCB).

It is of urgent necessity for a high-frequency device to enable high-frequency operation in the field of electronic components, and therefore electronic component-related materials such as semiconductor sealing material have low dielectric constant and materials having low dielectric dissipation factor have recently been required.

However, epoxy resin cured substrates, such as substrates, are apt to cause signal delay or loss in high frequency applications due to the high dielectric constant and dielectric dissipation factor of epoxy resin. In particular, it is important to maintain the signal transmission speed and quality for high frequency communication and computing electronic products.

Although modified epoxy resin has been developed for reducing the dielectric constant and dielectric dissipation factor thereof, recent required levels for low dielectric constant and low dielectric dissipation factor have never been realized.

Therefore, development of novel materials with low dielectric constant, low dielectric dissipation factor, high thermal endurance, and high glass transition temperature (Tg) for serving as substrates are desired.

SUMMARY

An embodiment of the disclosure provides a resin composition. The resin composition includes a polyphenylene ether compound; and a bismaleimide compound, wherein the polyphenylene ether compound has a Formula (I), of:

$$(Z-Y)_3-X \quad \text{Formula (I)}$$

wherein, X is

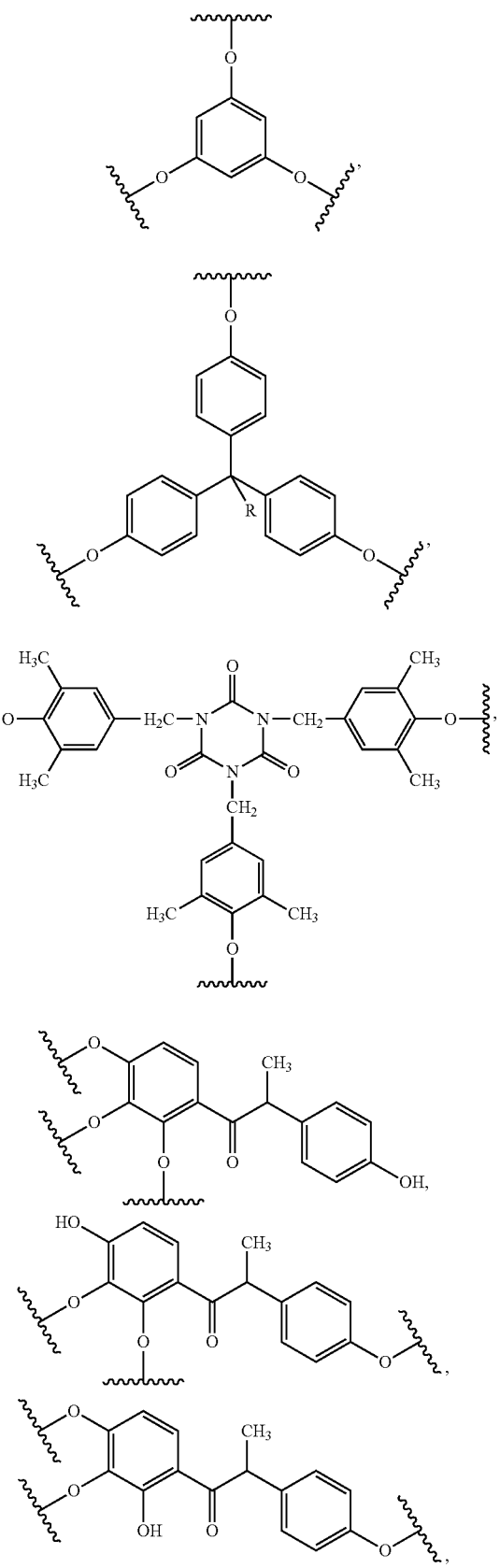

-continued

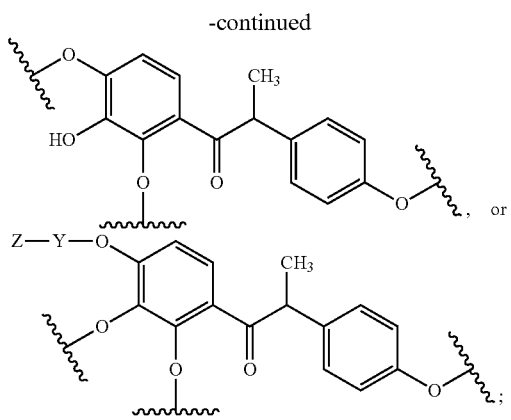

R is hydrogen, or $C_{1-6}$ alkyl group; Y is independently a moiety prepared by polymerizing at least two different phenols; and Z is independently hydrogen, acryloyl group, allyl group, vinylbenzyl group, epoxypropyl group, methacryloyl group, propargyl group, or cyanoallyl group.

Another embodiment of the disclosure provides a prepreg, which is obtained by curing the aforementioned resin composition.

Yet another embodiment of the disclosure provides a substrate, which is obtained by impregnating a fiber film into the aforementioned resin composition and then curing the fiber film. The substrate can exhibit a low dielectric constant, low dielectric dissipation factor, high thermal endurance, and high glass transition temperature.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

The disclosure provides a resin composition including a multi-segment polyphenylene ether compound with reactive functional groups, and a bismaleimide compound. In particular, the product obtained by curing the resin composition has improved electrical characteristics (such as dielectric constant and dielectric dissipation factor), chemical resistance, coefficient of thermal expansion, thermal endurance and mechanical properties (such as adhesion strength, viscosity and processability). Furthermore, embodiments of the disclosure provide a prepreg and a substrate including the prepreg, wherein the prepreg includes a product obtained by curing the resin composition.

According to an embodiment of the disclosure, since the resin composition includes a polyphenylene ether compound and a bismaleimide compound, a product obtained by curing the resin composition can have an improved the degree of polymerization. The resin composition can further include a polybutadiene or copolymer thereof to increase the crosslink density of the product by curing the resin composition. Therefore, the product obtained by curing the resin composition can exhibit superior electrical characteristics and high thermal endurance.

According to an embodiment of the disclosure, due to adjusting the amount of the polyphenylene ether compound and the bismaleimide compound in the resin composition, a prepreg obtained by curing the resin composition can have a semi-interpenetrating polymer network (semi-IPN) structure, which enhances the glass transition temperature, and reduces the dielectric constant and the dielectric dissipation factor of the prepreg.

According to an embodiment of the disclosure, the repeat unit of polybutadiene or copolymer thereof can have a terminal reactive functional group, wherein the terminal reactive functional group can be carboxyl group, acryloyl group, vinyl group, allyl group, and styryl group. On the other hand, the repeat unit of polybutadiene or copolymer thereof can have a terminal alkyl group such as methyl group. In addition, the polybutadiene can have a repeat unit of

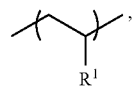

and a repeat unit of

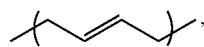

wherein $R^1$ is carboxyl group, acryloyl group, vinyl group, allyl group, or styryl group. Further, the repeat units of

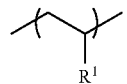

and the repeat units of

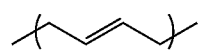

are arranged in a random or block fashion.

According to an embodiment of the disclosure, the polyphenylene ether compound has a Formula (I), of:

$$(Z-Y)_{\overline{3}}-X \qquad \text{Formula (I)}$$

wherein, X is

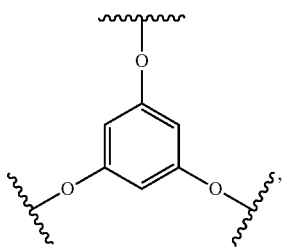

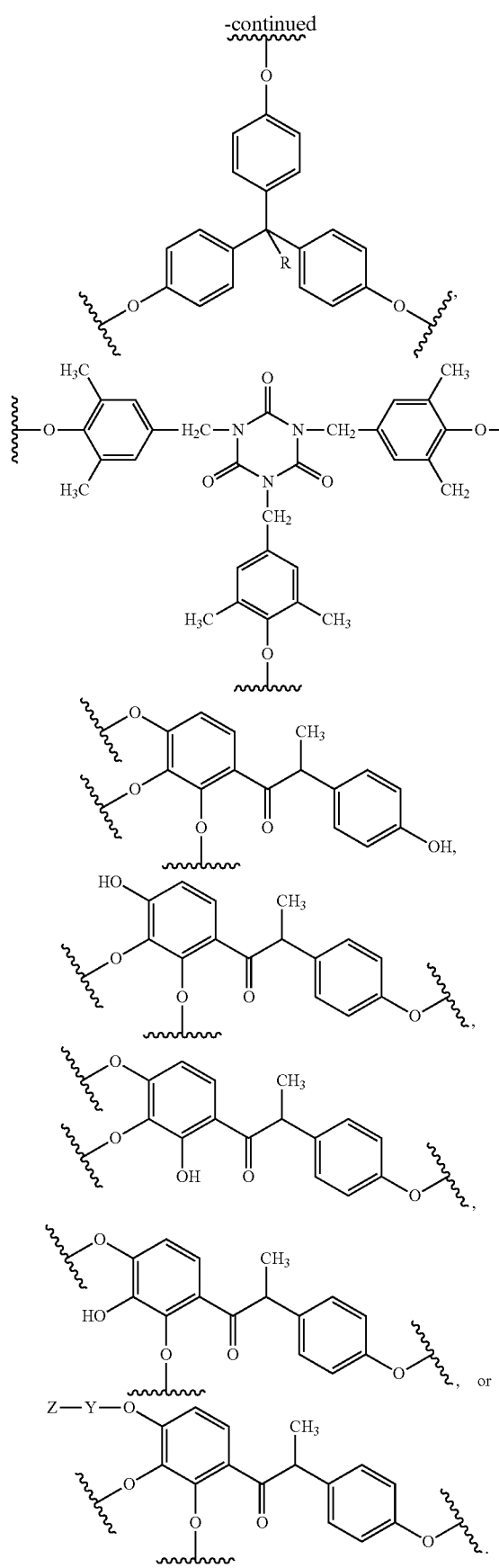

The moiety X is bonded with the moiety Y via the oxygen atom (bonded with a zig-zag line). R is hydrogen, or $C_{1-6}$ alkyl group; Y is independently a moiety prepared by polymerizing at least two different phenols. Namely, in Formula (I), Y can be the same or different. Z is independently hydrogen, acryloyl group

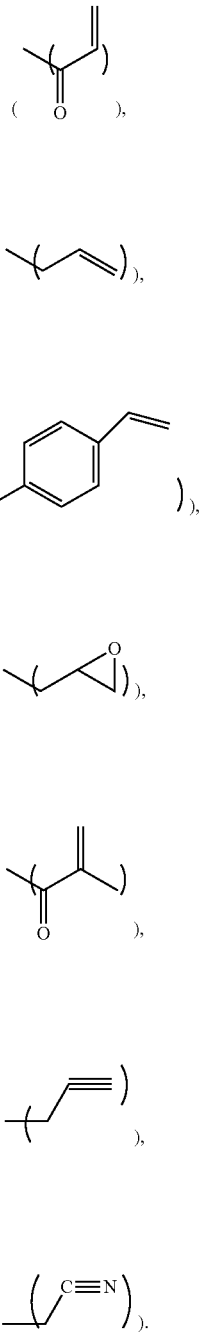

allyl group, vinylbenzyl group, epoxypropyl group, methacryloyl group, propargyl group, or cyanoallyl group.

Namely, in Formula (I), Z can be the same or different. In one embodiment, the polyphenylene ether compound has a weight-average molecular weight of more than 600, such as between 1200 and 12000. Further, the phenol group of the polyphenylene ether compound can further have at least one functional group such as methyl or allyl group. Further, Z can also be non-reactive functional groups, such as methyl.

In some embodiments of the disclosure, Y is independently a moiety prepared by polymerizing at least two different phenols. In particular, the at least two different phenols can be independently a phenol with at least one functional group, wherein the functional group is methyl, or allyl group. In one embodiment of the disclosure, Y can be a moiety prepared by polymerizing 2,6-dimethylphenol and 2-allyl-6-methylphenol, having a structure represented by

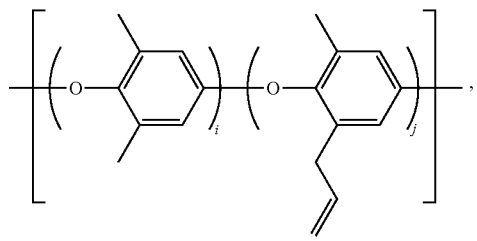

wherein i is a positive integer, j is a positive integer, and the sum of i and j is between 6 and 300. Further, the repeat units

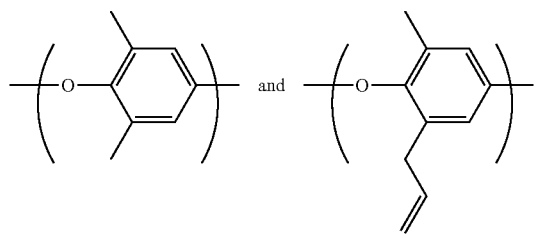

are arranged in a random or block fashion. Further, the sum of i and j of each Y in Formula (I) can be the same or different.

In another embodiment of the disclosure, the polyphenylene ether compound has a Formula (II), of:

$$\left[ Z\!-\!\!\left(\!O\!-\!\!\underset{R^3}{\overset{R^2}{\bigcirc}}\!\right)_{\!\!n}\!\!-\!X\right]_3 \quad (II)$$

wherein X is

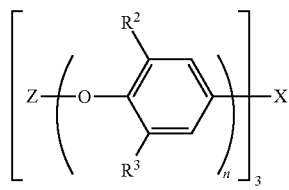

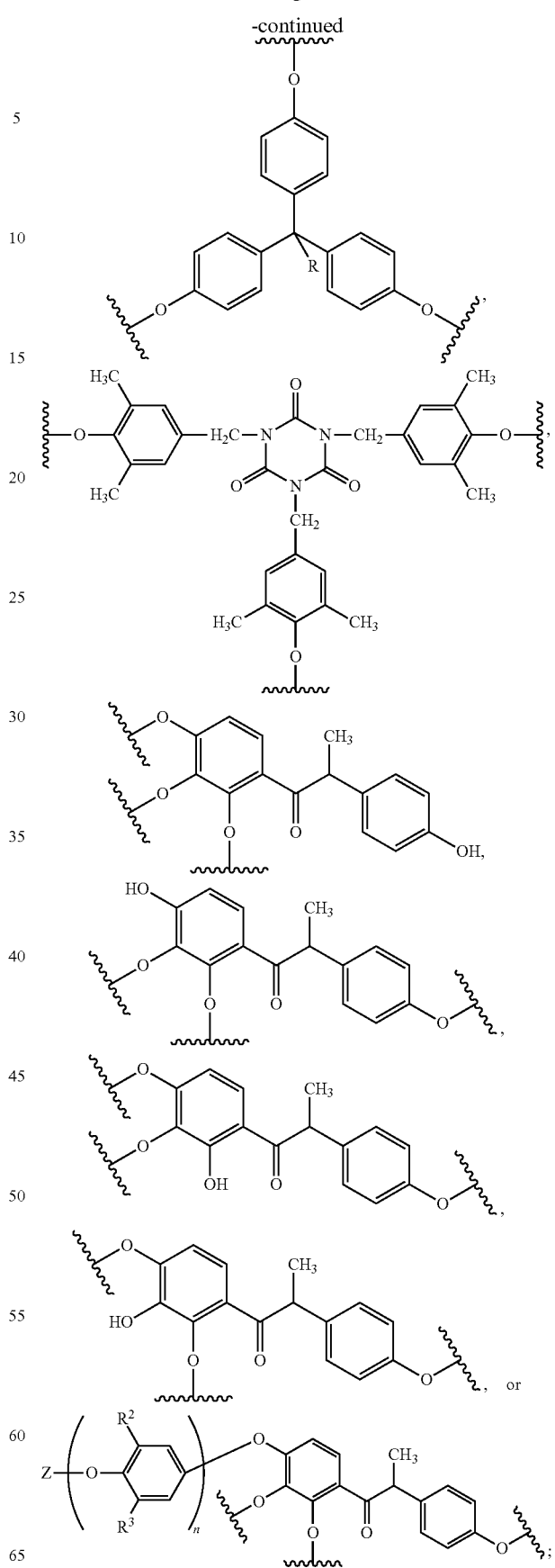

n is independently a positive integer between 6 and 300; R is hydrogen, or $C_{1-6}$ alkyl group; $R^2$ is independently hydrogen, or $C_{1-6}$ alkyl group; $R^3$ is independently a $C_{1-6}$ alkyl group, or allyl group; and Z is independently hydrogen, acryloyl group, allyl group, vinylbenzyl group, epoxypropyl group, methacryloyl group, propargyl group, or cyanoallyl group.

In an embodiment of the disclosure, the polyphenylene ether compound can have a core moiety derived from 1,3,5-trihydroxybenzene and three moieties bonded on the hydroxyl residue groups of the core, where the moieties are prepared by polymerizing 2,6-dimethylphenol and 2-allyl-6-methylphenol. Herein, the terminal group of the polyphenylene ether compound can be hydrogen, and the polyphenylene ether compound can have a Formula (III), of:

Formula (III)

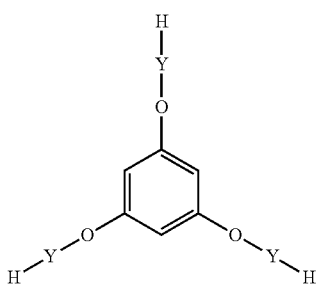

In Formula (III), the moiety Y is prepared by polymerizing 2,6-dimethylphenol and 2-allyl-6-methylphenol, Therefore, Y can have i number of (i is equal to or greater than 1) repeat units represented by

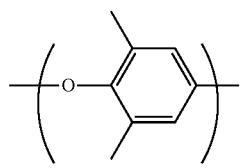

and j number of (j is equal to or greater than 1) repeat units represented by

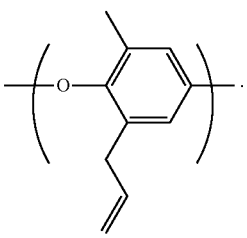

Further, the sum of i and j is between 6 and 300. In addition, the repeat units represented by

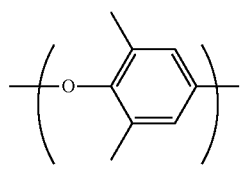

and the repeat units represented by

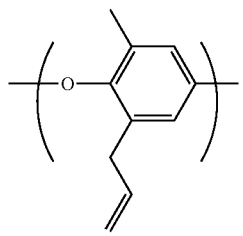

are arranged in a random or block fashion. It should be noted that the sum of i and j of each Y in Formula (III) can be the same or different, and Y in Formula (III) can be also the same or different.

In another embodiment of the disclosure, the moiety Y of polyphenylene ether compound having Formula (III) can be further modified. For example, the terminal hydroxyl group of moiety Y can be further reacted with an acryloyl chloride, allyl chloride, 4-vinylbenzyl chloride, 1-chloro-2,3-epoxypropane, methylacryloyl chloride, propargyl chloride, or chloroacetonitrile. Therefore, the polyphenylene ether compound can have a structure represented by

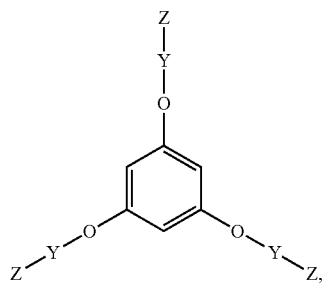

wherein the definition of Z has the same meaning as described above.

It should be noted that the described above embodiments are merely illustrative, and not restrictive. The polyphenylene ether compounds of the disclosure are not limited to being prepared by the aforementioned process and compounds. According to embodiments of the disclosure, the core moiety of the polyphenylene ether compound can be derived from a compound having at least three hydroxyl groups, wherein the compound can be

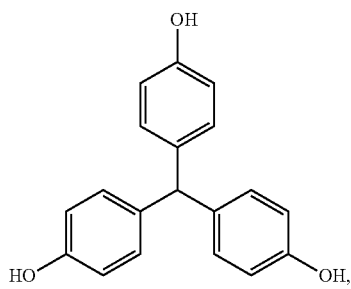

-continued

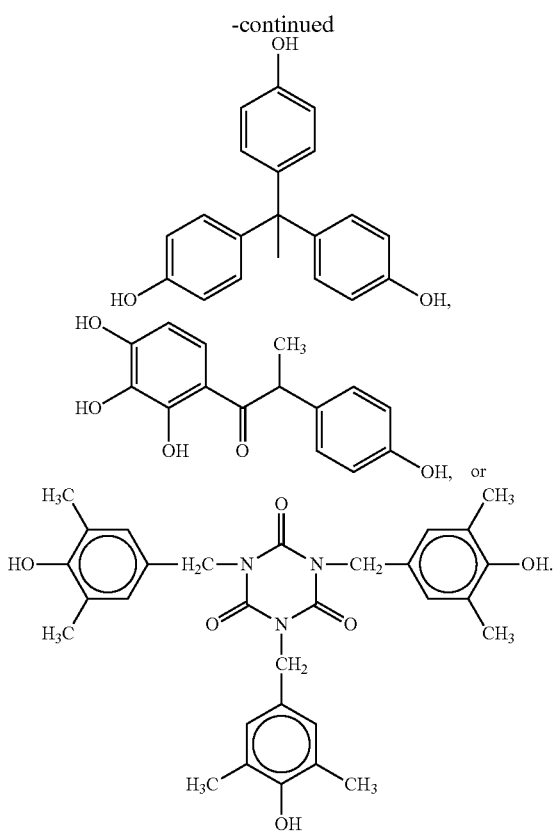

Further, according to other embodiments of the disclosure, the polyphenylene ether compound can have a main chain which is polymerized by phenol monomers. For example, the phenol monomer can have a reactive functional group such as allyl group, epoxy group, acrylate group, propargyl group, or others.

According to an embodiment of the disclosure, the bismaleimide compound can be

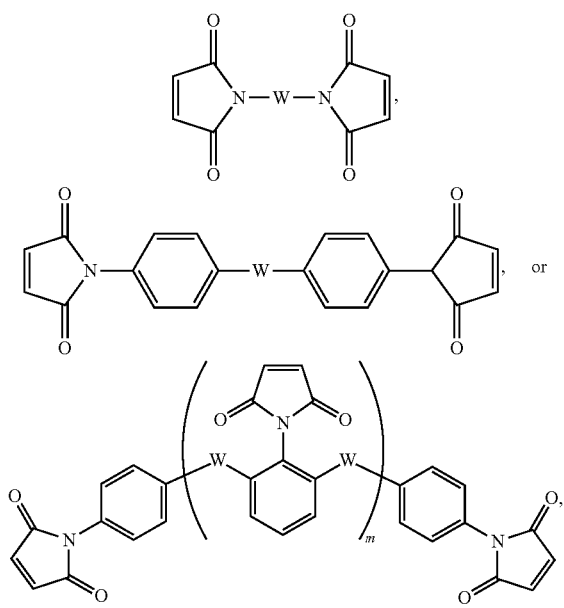

wherein W is aromatic group, aliphatic group, cyclic aliphatic group, or aliphatic group containing silane, and m is equal to or larger than 1. The addition of the bismaleimide compound (BMI) for the resin composition can increase the crosslinking degree of a product obtained by curing the resin composition. Therefore, the product obtained by curing the resin composition can have a PPE/BMI/PB (polyphenylene ether compound/bismaleimide compound/polybutadiene) semi-interpenetrating polymer network (semi-IPN) structure, resulting in high glass transition temperature, low dielectric constant, and low dielectric dissipation factor of the product. Further, the prepreg obtained by curing the resin composition can have superior solvent resistance and thermal endurance, and thereby be suitable for use in the manufacture of circuit boards. Further, the addition of the bismaleimide compound of the resin composition can increase the glass transition temperature and the adhesion strength of the resin composition. On the other hand, the viscosity of the resin composition can be modified by the addition of the bismaleimide compound. With the increasing amount of bismaleimide compound, the resin composition can have a relatively low viscosity. Therefore, when a fiber film (such as glass fabric, or plastic fabric) is impregnated into the resin composition, the impregnation effect of the fiber film can be improved.

According to embodiments of the disclosure, the polybutadiene can have a weight percentage of between 1 and 94 wt %, the polyphenylene ether compound can have a weight percentage of between 5 and 98 wt %, and the bismaleimide compound can have a weight percentage of between 1 and 30 wt %, based on the total weight of the polybutadiene, polyphenylene ether compound, and the bismaleimide compound.

According to other embodiments of the disclosure, the resin composition can further include triallyl isocyanurate, wherein the ratio between the weight of the triallyl isocyanurate and the total weight of the polybutadiene, polyphenylene ether compound, and the bismaleimide compound is between 0.01-0.25. The addition of the triallyl isocyanurate of the resin composition can increase the reactivity and adhesion strength and reduce the viscosity and the curing temperature of the resin composition.

Further, the resin composition of the disclosure can further include an initiator, such as a peroxide initiator. The peroxides initiator can be an initiator, used for low temperature curing, such as benzoyl peroxide (BPO), or diacyl peroxide. The resin composition of the disclosure can have a curing temperature of between 180-230° C., which is equal to or lower than the operating temperature limit (230° C.) of the conventional circuit board manufacturing equipment. Moreover, the resin composition of the disclosure can further include a flame retardant and an inorganic powder (or a polyimide powder). The flame retardant can be a bromine-containing or phosphorus-containing flame retardant. The inorganic powder can be $Al(OH)_3$, $Al_2O_3$, $Mg(OH)_2$, $MnO_2$, or $SiO_2$. In an embodiment of the disclosure, the inorganic powder can be $SiO_2$. The addition of the inorganic powder of the resin composition can reduce the coefficient of thermal expansion (CTE) of the product obtained by curing the resin composition due to the high dimensional stability of the inorganic powder.

According to an embodiment of the disclosure, the disclosure provides a prepreg, which is obtained by curing the aforementioned resin composition via a process (such as thermal lamination process). Further, according to other embodiments of the disclosure, the disclosure provides a substrate, and the substrate can include the prepreg obtained by curing the resin composition. Further, the substrate can be obtained by impregnating a fiber film (such as glass fabric, or plastic fabric (i.e. polyimide fabric or liquid crystal polymer (LCP) fabric) and then subjecting the fiber film to a thermal lamination process. According to other embodiments of the disclosure, the resin composition can be coated on a metal foil, or a metal foil can be laminated on the prepreg, obtaining the substrate (such as a resin coated copper (RCC)). The substrate can be applied in a printed circuit board, integrated circuit board, or high frequency substrate.

Below, exemplary embodiments will be described in detail so as to be easily realized by a person having ordinary knowledge in the art. The disclosure concept may be embodied in various forms without being limited to the exemplary embodiments set forth herein.

Preparation of Polyphenylene Ether Compound

Preparation Example 1

3.42 g (24 mmol) of Copper (I) bromide, 314 ml of dibutylamine (1690 mmol), 6 g of 1,3,5-trihydroxybenzene (47.5 mmol), and 500 mL of toluene (500 mL) were added into a reaction bottle. Next, under an oxygen atmosphere (with a flow rate of 3 L/min), the mixture was stirred at 50° C. for 20 min. Next, 58.1 g of 2,6-dimethylphenol (470 mmol), 22 g of 2-allyl-6-methylphenol (96 mmol), and a catalyst amount of hydrochloric acid were added into the reaction bottle. Next, after stirring, a great amount of methanol was added into the reaction bottle, resulting in a precipitate being formed. Next, the precipitate was filtered and collected, and then was dried at 50, obtaining a polyphenylene ether compound (1) with a yield of 52%. The characteristics of the polyphenylene ether compound (1) were measured and are shown below: dielectric constant (Dk)=3.05; dielectric dissipation factor (Df)=0.004; glass transition temperature (Tg)=196 t. The synthesis pathway of the above reaction was as follows:

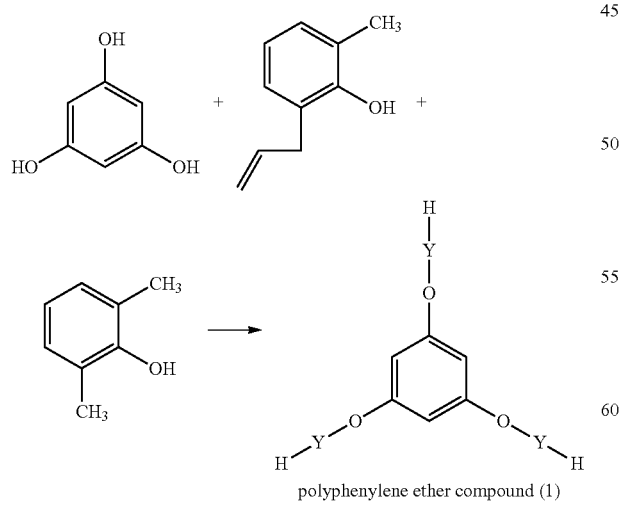

polyphenylene ether compound (1)

(wherein, Y are the same or different. Y have i number of repeat unit

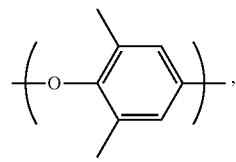

and j number of repeat unit

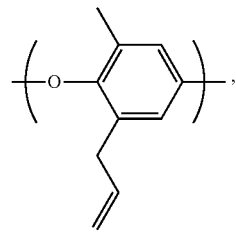

wherein i is a positive integer, j is a positive integer, and the sum of i and j is between 6-300. Further, repeat units

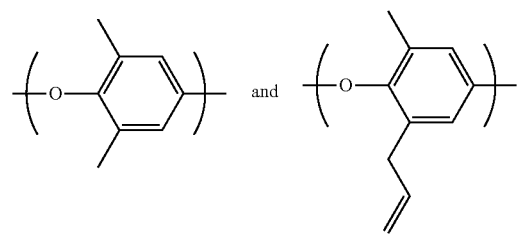

are arranged in a random or block fashion. Y is bonded with the oxygen residual group of the core moiety

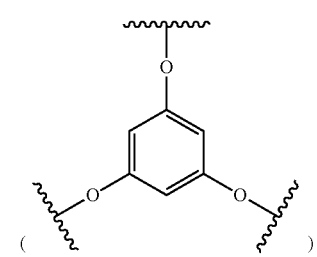 [SMILES: *Oc1cc(O*)cc(O*)c1]

via the carbon atom of the benzene of the repeat unit

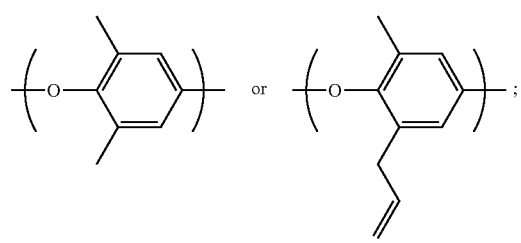

Further, Y is bonded with a hydrogen atom via the oxygen residual group of the repeat unit

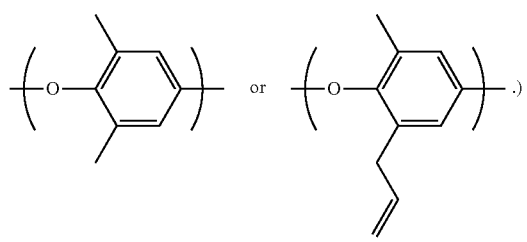 .)

The NMR measurement of the polyphenylene ether compound (1) is listed below: $^1$H NMR: δ 7.08 ppm, δ 6.5 ppm, 5.86 ppm, 5.01 ppm), 3.24 ppm; $^{13}$C NMR: δ 154 ppm, δ 150.8 ppm, δ 145.3 ppm, 136.6 ppm, 134.8 ppm, δ 133.5 ppm, δ 131.7 ppm, δ 128.8 ppm, δ 115.9 ppm, δ 114.2 ppm, δ 34.4 ppm, δ 16.8 ppm.

In addition, the polyphenylene ether compound (1) was analyzed by Gel Permeation Chromatography (GPC), and the weight-average molecular weight (Mw) of the polyphenylene ether compound (1) was about 5003 and the polydispersity (DPI) of the polyphenylene ether compound (1) was about 1.98.

Preparation Example 2

10 g of 1-chloro-2,3-epoxypropane (100 mmol), 1 g of polyphenylene ether compound (1) (0.154 mmol), and 20 ml of toluene were added into a 100 ml reaction bottle. After stirring at 60° C. under a nitrogen gas atmosphere, 1 g of 2-methoxyethanol (13 mmol) was added into the reaction bottle, and then the solvent was removed by vacuum. Next, the result was dissolved in tetrahydrofuran, and a great amount of methanol was added into the reaction bottle, resulting in a precipitate being formed. Next, the precipitate was filtered and collected, and then was dried at 50° C., obtaining a polyphenylene ether compound (2). The characteristics of the polyphenylene ether compound (2) were measured and are shown below: dielectric constant (Dk)=2.91; dielectric dissipation factor (Df)=0.005; glass transition temperature (Tg)=190° C. The synthesis pathway of the above reaction was as follows:

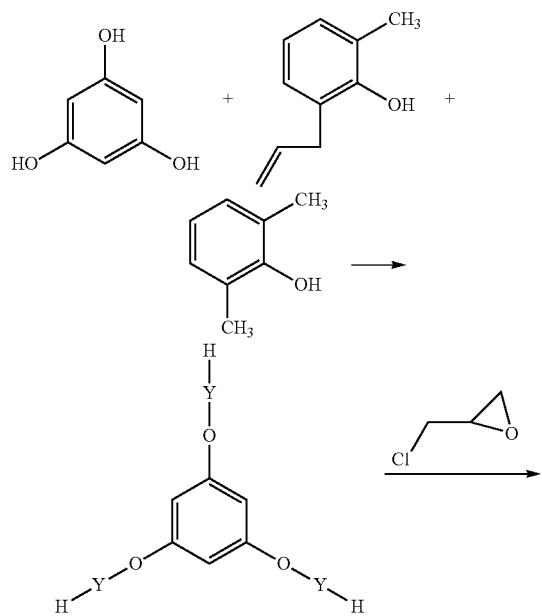

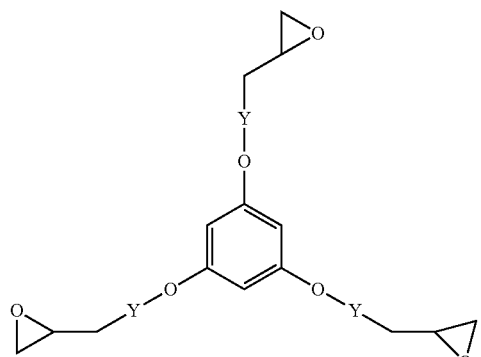

polyphenylene ether compound (2)

(wherein, Y are the same or different. Y have i number of repeat unit

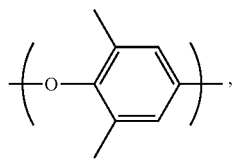

and j number of repeat unit

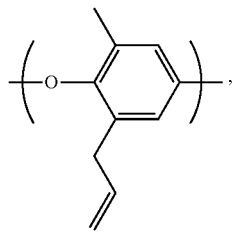

wherein i is a positive integer, j is a positive integer, and the sum of i and j is between 6-300. Further, repeat units

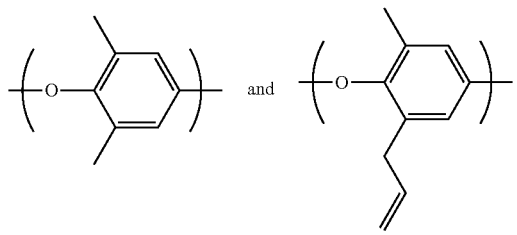

are arranged in a random or block fashion. Y is bonded with the oxygen residual group of the core moiety

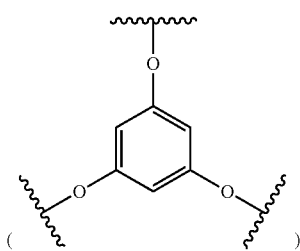

via the carbon atom of the benzene of the repeat unit

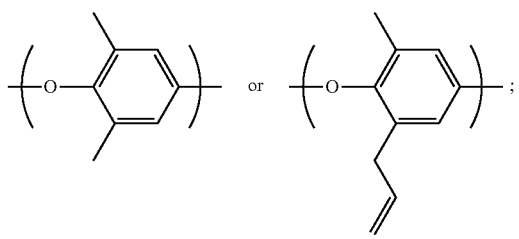

Further, Y is bonded with the epoxypropyl group via the oxygen residual group of the repeat unit

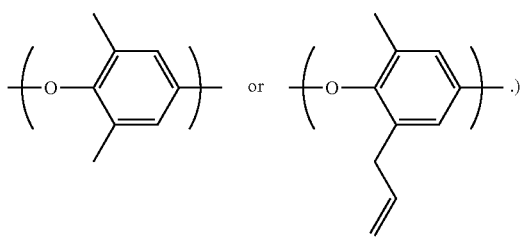

The NMR measurement of the polyphenylene ether compound (2) is listed below: $^1$H NMR: δ 2.0 ppm, δ 2.72 ppm, δ 2.81 ppm, δ 3.20 ppm, δ 3.28 ppm, δ 3.72 ppm, δ 3.96 ppm, δ 4.95 ppm, δ 5.82 ppm, δ 6.38 ppm, δ 7.08 ppm.

In addition, the polyphenylene ether compound (2) was analyzed by Gel Permeation Chromatography (GPC), and the weight-average molecular weight (Mw) of the polyphenylene ether compound (2) was about 6520 and the polydispersity (DPI) of the polyphenylene ether compound (2) was about 1.91.

Preparation Example 3

1 g of polyphenylene ether compound (1) (0.154 mmol), and 10 ml of tetrahydrofuran were added into a 100 ml reaction bottle. After stirring at 60° C. under nitrogen gas atmosphere, 0.2 g of sodium hydroxide aqueous solution (50 wt %), and 0.8 mL of 4-chloromethylstyrene (1.1 mmol). After reacting, the result was washed by DI water for removing impurity salts. Next, the result was dissolved in tetrahydrofuran, and a great amount of methanol was added into the reaction bottle, resulting in a precipitate being formed. Next, the precipitate was filtered and collected, and then was dried at 50° C., obtaining a polyphenylene ether compound (3). The synthesis pathway of the above reaction was as follows:

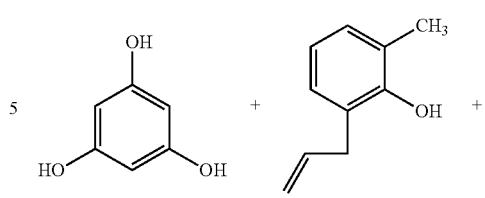

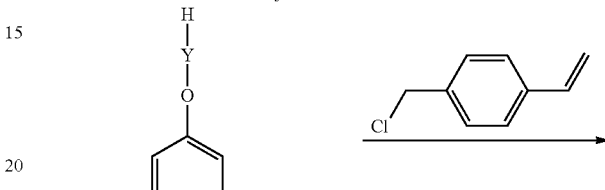

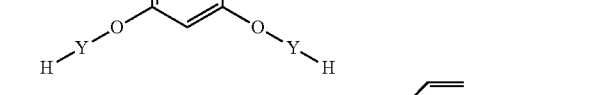

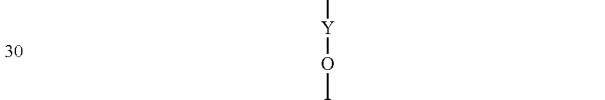

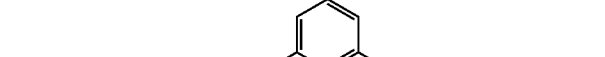

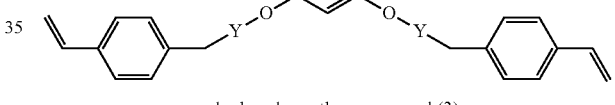

polyphenylene ether compound (3)

(wherein, Y are the same or different. Y have i number of repeat unit

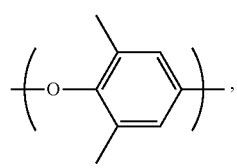

and j number of repeat unit

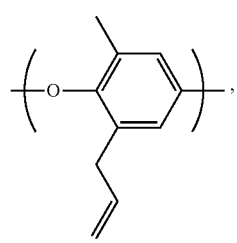

wherein i is a positive integer, j is a positive integer, and the sum of i and j is between 6-300. Further, repeat units

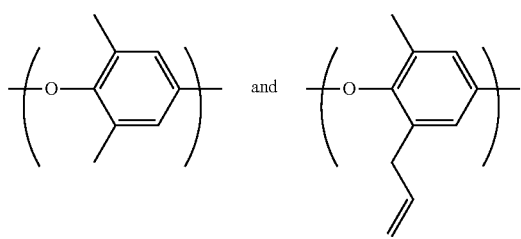

are arranged in a random or block fashion. Y is bonded with the oxygen residual group of the core moiety

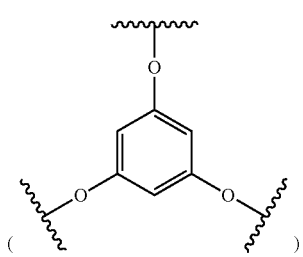 [SMILES: *Oc1cc(O*)cc(O*)c1]

via the carbon atom of the benzene of the repeat unit

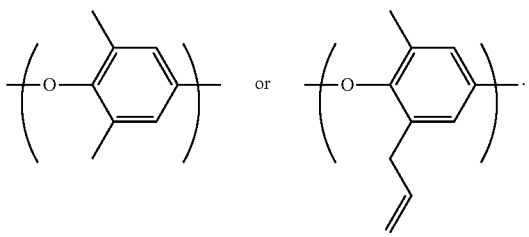

Further, Y is bonded with the vinylbenzyl group via the oxygen residual group of the repeat unit

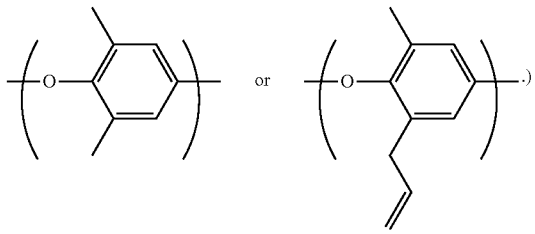

The NMR measurement of the polyphenylene ether compound (3) is listed below: $^1$H NMR: δ 2.72 ppm, δ 3.28, δ 4.32 ppm, δ 4.32 ppm, δ 4.98 ppm, δ 5.86 ppm, δ 6.38 ppm, δ 7.08 ppm, δ 7.38 ppm.

In addition, the polyphenylene ether compound (3) was analyzed by Gel Permeation Chromatography (GPC), and the weight-average molecular weight (Mw) of the polyphenylene ether compound (3) was about 6579 and the polydispersity (DPI) of the polyphenylene ether compound (3) was about 1.91.

Preparation Example 4

1 g of polyphenylene ether compound (1) (0.154 mmol), and 10 ml of tetrahydrofuran were added into a 100 ml reaction bottle. After stirring at 60° C. under nitrogen gas atmosphere, 0.2 g of sodium hydroxide aqueous solution (50 wt %), and 0.8 mL of methacryloyl chloride (7 mmol) were added into the reaction bottle. After reacting, the result was washed by DI water for removing impurity salts. Next, the result was dissolved in tetrahydrofuran, and a great amount of methanol was added into the reaction bottle, resulting in a precipitate being formed. Next, the precipitate was filtered and collected, and then was dried at 50° C., obtaining a polyphenylene ether compound (4).

The synthesis pathway of the above reaction was as follows:

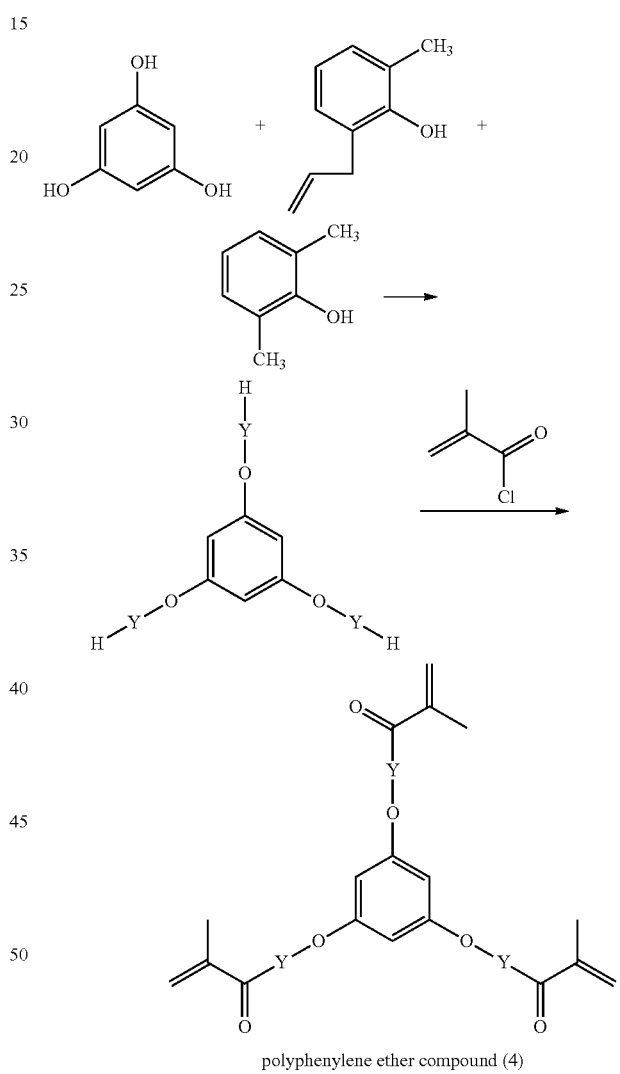

polyphenylene ether compound (4)

(wherein, Y are the same or different. Y have i number of repeat unit

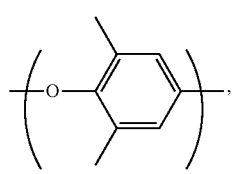

and j number of repeat unit

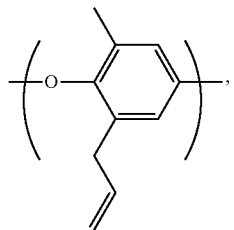

wherein i is a positive integer, j is a positive integer, and the sum of i and j is between 6-300. Further, repeat units

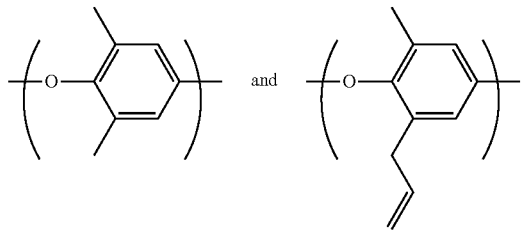

are arranged in a random or block fashion. Y is bonded with the oxygen residual group of the core moiety

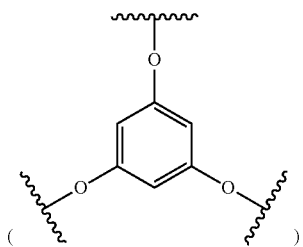 [SMILES: *Oc1cc(O*)cc(O*)c1]

via the carbon atom of the benzene of the repeat unit

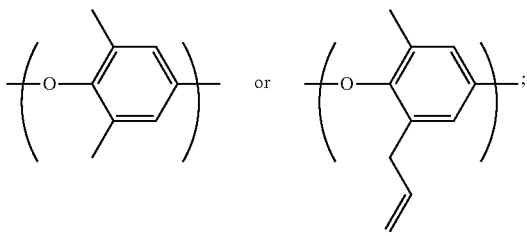

Further, Y is bonded with the methacryloyl group via the oxygen residual group of the repeat unit

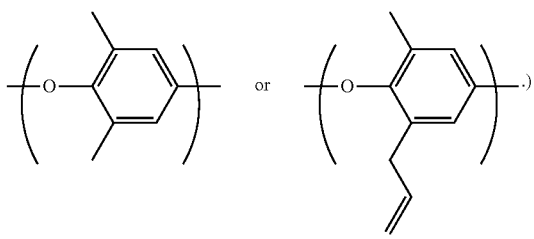

The NMR measurement of the polyphenylene ether compound (4) is listed below: $^1$H NMR: δ 1.92 ppm, δ 2.18 ppm, δ 3.26 ppm, δ 4.98 ppm, δ 5.24 ppm, δ 5.76 ppm, δ 6.32 ppm, δ 7.08 ppm.

In addition, the polyphenylene ether compound (4) was analyzed by Gel Permeation Chromatography (GPC), and the weight-average molecular weight (Mw) of the polyphenylene ether compound (4) was about 6535 and the polydispersity (DPI) of the polyphenylene ether compound (4) was about 1.91.

Preparation of Resin Composition

Example 1

The polyphenylene ether compound (3) (100 parts by weight), polybutadiene having vinyl groups (RICON100) (60 parts by weight), and bismaleimide (BMI-2300) (8 parts by weight) were added into a reactor, and dissolved in γ-butyrolactone (GBL), xylene, and toluene. Next, the mixture was stirred and heated. After cooling to room temperature, triallyl isocyanurate (TAIL) (25 parts by weight), peroxide (Luperox® 101) (2 parts by weight), flame retardant (BT-93W), and silicon oxide (serving as inorganic powder) were added, obtaining the resin composition (1).

Examples 2-5

Examples 2-5 were performed the same way as Example 1, except that the parts by weight of the polyphenylene ether compound (3), the polybutadiene having vinyl groups (RICON100), the bismaleimide (BMI-2300), the triallyl isocyanurate (TAIL), and the peroxide (Luperox® 101) was allocated according to Table 1, obtaining the resin composition (2)-(5).

TABLE 1

| | Example 1 | Example 2 | Example 3 | Example 4 | Example 5 |
|---|---|---|---|---|---|
| polyphenylene ether compound 3 (parts by weight) | 100 | 100 | 100 | 100 | 100 |
| RICON100 (parts by weight) | 60 | 67 | 17 | 133 | 0 |
| BMI-2300 (parts by weight) | 8 | 33 | 8 | 8 | 8 |
| TAIC (parts by weight) | 25 | 42 | 42 | 42 | 42 |
| Luperox ® 101 (parts by weight) | 2 | 2 | 2 | 4 | 2 |

Comparative Example 1

A non-modified polyphenylene ether compound (SA-9000) (100 parts by weight), polybutadiene having vinyl groups (RICON100) (60 parts by weight) and bismaleimide (BMI-2300) (8 parts by weight) were added into a reactor, and dissolved in γ-butyrolactone (GBL), xylene, and toluene. Next, the mixture was stirred and heated. After cooling to room temperature, triallyl isocyanurate (TAIL) (25 parts by weight), peroxide (Luperox® 101) (2 parts by weight), flame retardant (BT-93W), and silicon oxide (serving as inorganic powder) were added, obtaining the resin composition (6).

Comparative Example 2

Bisphenol-A diglycidyl ether (code: 188EL, CHANG CHUN PLASTICS CO., LTD., Taiwan) (20 parts by weight), bismaleimide (BMI, sold by Ki-chemical) (30 parts by weight), and polybutadiene having branched maleic anhydride and terminal hydroxyl groups (RICON 130, sold by Sartomer) (80 parts by weight) were added into a reactor, and dissolved in γ-butyrolactone (GBL), xylene, and toluene. Next, a small amount of peroxide (benzoyl peroxide, BPO) was added into the reactor. After heating to 100° C. for 1 hr, a solution (A) was obtained.

On the other hand, a phenylene ether (code: PPE E200, Sumitomo chemical) (100 parts by weight) was added into a reactor and dissolved into toluene and xylene. Next, terpene phenol novolak resin (code: MP402, Yuka Shell Epoxy Co. Japan) (6 parts by weight), peroxide (BPO) (1 parts by weight), and 4,4'-Methylenebis(N,N-diglycidylaniline)) (5 parts by weight) were added into the reactor. After heating to 100° C. for 2 hr, a solution (B) was obtained, wherein the solution (B) has a relatively low molecular weight (between 3000 and 8000).

Next, the solution (A) and the solution (B) were mixed, and a peroxide (di-tert-butyl peroxide) (1 parts by weight) was added into the mixture. Next, the mixture was heated to 110° C. for 3 hrs. After cooling, triallyl isocyanurate (triallyl isocyanurate, TAIL) (30 parts by weight), flame retardant (BT-93W), and silicon oxide were added into the reactor, obtaining the resin composition 7.

Comparative Example 3

A non-modified polyphenylene ether compound (OPE-2St) (100 parts by weight), polybutadiene having vinyl groups (RICON100) (67 parts by weight) and bismaleimide (BMI-2300) (33 parts by weight) were added into a reactor, and dissolved in δ-butyrolactone (GBL), xylene, and toluene. Next, the mixture was stirred and heated. After cooling to room temperature, triallyl isocyanurate (TAIL) (42 parts by weight), peroxide (Luperox® 101) (2 parts by weight), flame retardant (BT-93W), and silicon oxide (serving as inorganic powder) were added, obtaining the resin composition (8).

Fabrication and Measurement of Substrates

Glass fabrics were respectively impregnated into the resin compositions (1)-(8) of Examples 1-5, and Comparative Examples 1-3. Next, the glass fabrics were baked to perform a curing process, obtaining prepregs (1)-(8) respectively. Next, the prepregs were laminated with copper foil at 230° C., obtaining copper foil substrates (1)-(8).

The glass transition temperature (Tg) of the cured products of resin compositions (1)-(8) was measured by dynamic mechanical spectrometer (DMA), and the electrical characteristics of the copper foil substrates (1)-(8) were measured by split post resonator. The results are shown in Table 2.

Accordingly, the prepreg obtained by curing the resin composition of the disclosure can have a PPE/BMI/PB (polyphenylene ether compound/bismaleimide compound/polybutadiene) semi-interpenetrating polymer network (semi-IPN) structure, resulting in high glass transition temperature, low dielectric constant, and low dielectric dissipation factor of the prepreg. Further, the prepreg exhibits superior solvent resistance and thermal endurance, and the substrate employing the same can be applied in a printed circuit board, integrated circuit board, or high frequency substrate.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A resin composition, comprising:
   a polyphenylene ether compound; and
   a bismaleimide compound, wherein the polyphenylene ether compound has a Formula (I), of:

Formula (I)

wherein, X is

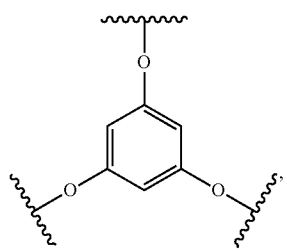

TABLE 2

|  | copper foil substrate 1 | copper foil substrate 2 | copper foil substrate 3 | copper foil substrate 4 | copper foil substrate 5 | copper foil substrate 6 | copper foil substrate 7 | copper foil substrate 8 |
| --- | --- | --- | --- | --- | --- | --- | --- | --- |
| glass transition temperature (° C.) (cured product of resin) | 212 | 193 | 214 | 194 | 228 | 184 | 182 | 184 |
| Dk @ 1 GHz | 3.55 | 3.57 | 3.65 | 3.3 | 3.8 | 3.6 | 3.6 | 3.60 |
| Df @ 1 GHz | 0.003 | 0.003 | 0.0035 | 0.0038 | 0.0045 | 0.004 | 0.006 | 0.003 |

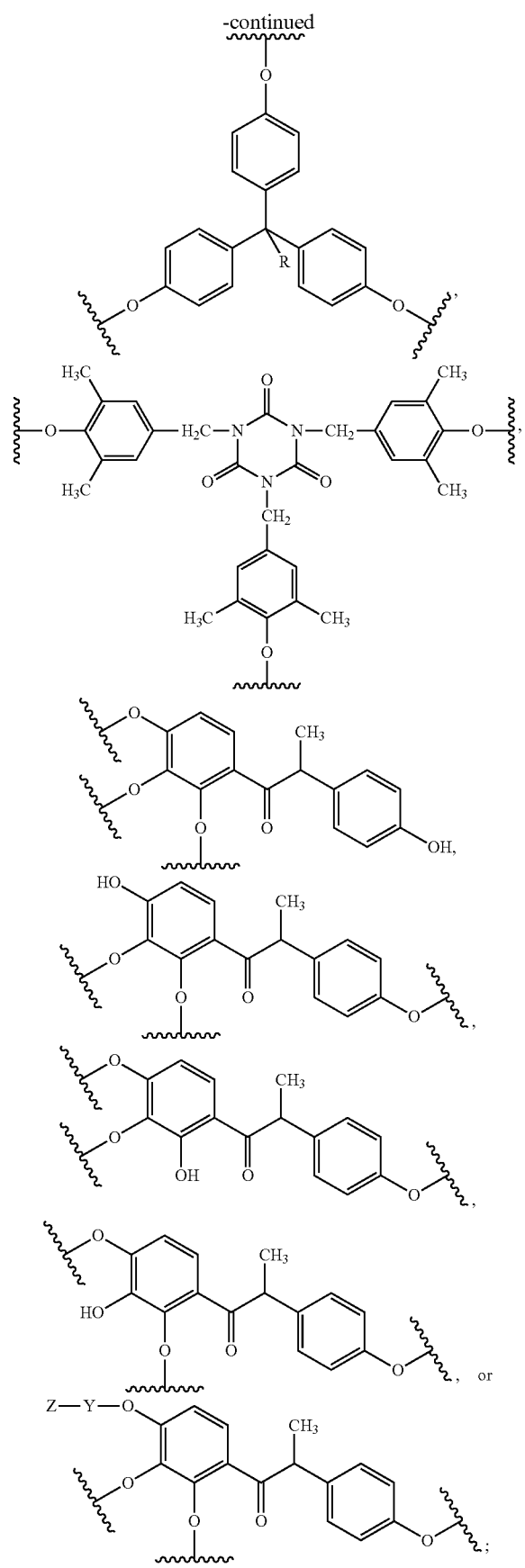

R is H, or $C_{1-6}$ alkyl group;

Y is independently a moiety prepared by polymerizing at least two different phenols; and Z is independently H, acryloyl group, allyl group, vinylbenzyl group, epoxypropyl group, methacryloyl group, propargyl group, or cyanoallyl group.

2. The resin composition as claimed in claim 1, further comprising a polybutadiene.

3. The resin composition as claimed in claim 2, wherein the polybutadiene has a repeat unit with a terminal reactive functional group, wherein the terminal reactive functional group is carboxyl group, acryloyl group, vinyl group, allyl group, or styryl group.

4. The resin composition as claimed in claim 2, wherein the polybutadiene has a repeat unit of

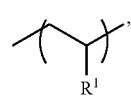

and a repeat unit of

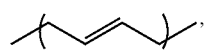

wherein $R^1$ is carboxyl group, acryloyl group, vinyl group, allyl group, and styryl group, and the repeat unit

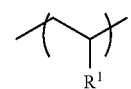

and the repeat unit

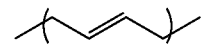

are arranged in a random or block fashion.

5. The resin composition as claimed in claim 2, wherein the polybutadiene has a weight percentage of between 1-94 wt %, the polyphenylene ether compound has a weight percentage of between 5 and 98 wt %, and the bismaleimide compound has a weight percentage of between 1 and 30 wt %, based on the total weight of the polybutadiene, the polyphenylene ether compound, and the bismaleimide compound.

6. The resin composition as claimed in claim 1, wherein the bismaleimide compound is

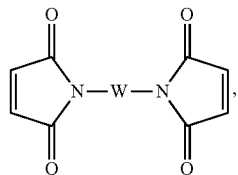

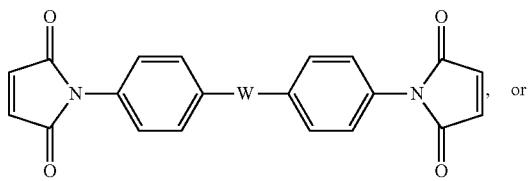, or

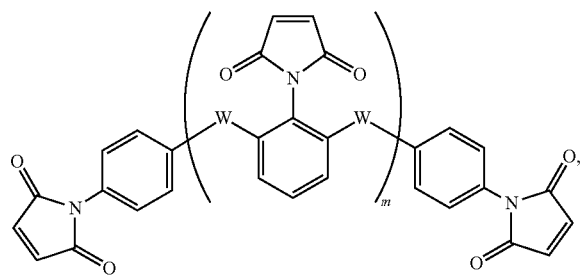

wherein W is aromatic group, aliphatic group, cyclic aliphatic group, or aliphatic group containing silane, and m is equal to or larger than 1.

7. The resin composition as claimed in claim 2, further comprising:
   a triallyl isocyanurate, wherein the ratio between the weight of the triallyl isocyanurate and the total weight of the polybutadiene, the polyphenylene ether compound, and the bismaleimide compound is between 0.01-0.25.

8. The resin composition as claimed in claim 1, further comprising:
   an inorganic powder or a polyimide powder, wherein the inorganic powder is $Al(OH)_3$, $Al_2O_3$, $Mg(OH)_2$, $MnO_2$, or SiO2.

9. The resin composition as claimed in claim 1, wherein the at least two different phenols respectively have at least one functional group, wherein the functional group is methyl group, or allyl group.

10. The resin composition as claimed in claim 1, wherein Y is a moiety prepared by polymerizing 2,6-dimethylphenol and 2-allyl-6-methylphenol.

11. The resin composition as claimed in claim 1, wherein Y is

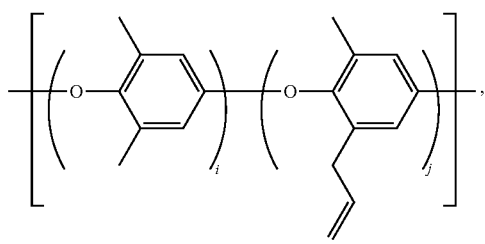

i is a positive integer, j is a positive integer, the sum of i and j is between 6 and 300, and repeat units

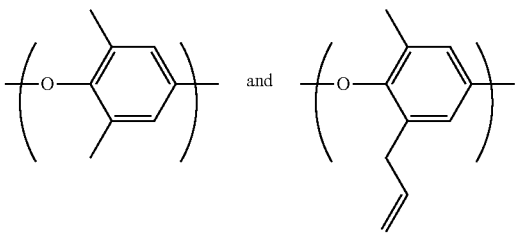

are arranged in a random or block fashion.

12. The resin composition as claimed in claim 1, wherein Z is hydrogen, epoxypropyl group, vinylbenzyl group, or methacryloyl group.

13. The resin composition as claimed in claim 1, wherein a weight-average molecular weight of the polyphenylene ether compound is larger than 600.

14. The resin composition as claimed in claim 1, wherein a weight-average molecular weight of the polyphenylene ether compound is between 1200 and 12000.

15. The resin composition as claimed in claim 1, wherein the polyphenylene ether compound has a Formula (II), of:

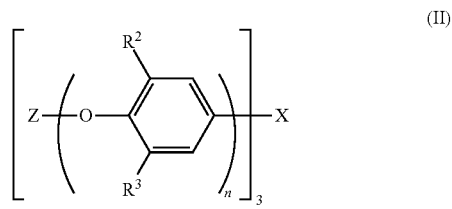

wherein, X is

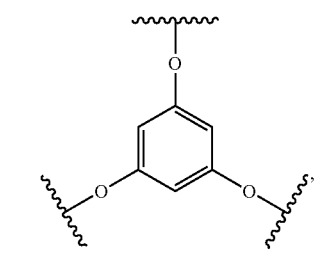

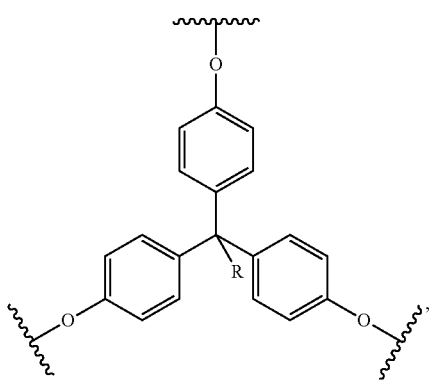

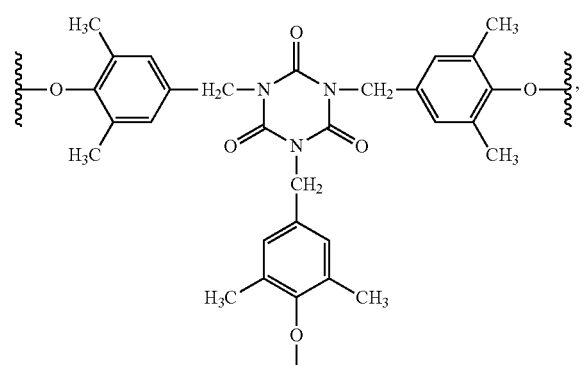

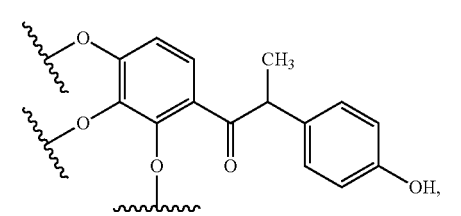

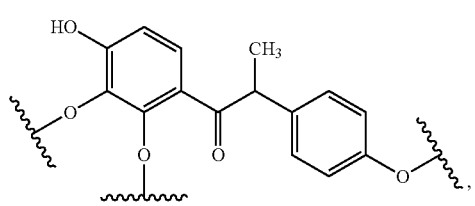

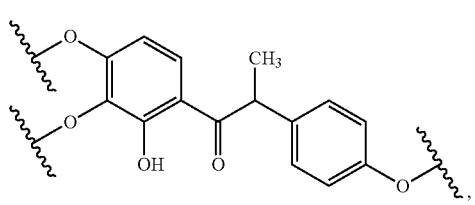

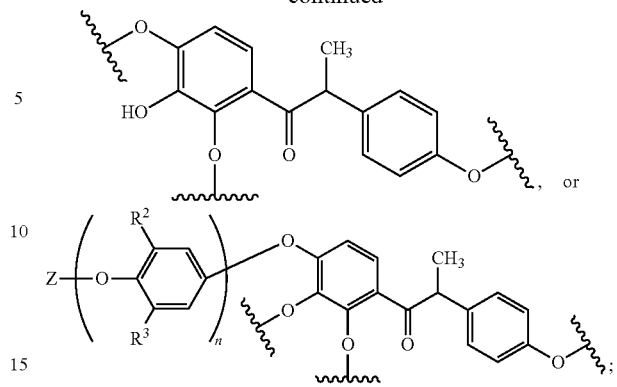

n is a positive integer from 6 to 300 independently;
R is H or $C_{1-6}$ alkyl group;
each $R^2$ is independently H, or $C_{1-6}$ alkyl group;
each $R^3$ is independently $C_{1-6}$ alkyl group, or allyl group; and
Z is independently H, acryloyl group, allyl group, vinylbenzyl group, epoxypropyl group, methacryloyl group, propargyl group, or cyanoallyl group.

16. A prepreg, comprising a cured product of the resin composition as claimed in claim 1.

17. A substrate, comprising a product fabricated by the following steps:
impregnating a fiber film into the resin composition as claim in claim 1; and
subjecting the fiber film to a curing process.

18. The substrate as claimed in claim 17, wherein the fiber film comprises a glass fiber, or plastic fiber.

19. The substrate as claimed in claim 17, further comprising:
a metal foil disposed on the fiber film.

20. The substrate as claimed in claim 19, wherein the substrate is applied in a printed circuit board, integrated circuit board, or high frequency substrate.

* * * * *